(12) United States Patent
Surthi et al.

(10) Patent No.: US 8,450,207 B2
(45) Date of Patent: May 28, 2013

(54) METHOD OF FABRICATING A CELL CONTACT AND A DIGIT LINE FOR A SEMICONDUCTOR DEVICE

(75) Inventors: Shyam Surthi, Boise, ID (US); Lars Heineck, Garden City, ID (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 225 days.

(21) Appl. No.: 13/164,778

(22) Filed: Jun. 21, 2011

(65) Prior Publication Data

US 2012/0329274 A1 Dec. 27, 2012

(51) Int. Cl.
*H01L 21/44* (2006.01)
*H01L 21/31* (2006.01)

(52) U.S. Cl.
USPC ............ 438/652; 438/656; 438/669; 438/791

(58) Field of Classification Search
None
See application file for complete search history.

(56) References Cited

U.S. PATENT DOCUMENTS

| | | | |
|---|---|---|---|
| 2004/0161918 A1* | 8/2004 | Yun ................................ | 438/618 |
| 2005/0003646 A1* | 1/2005 | Park et al. ..................... | 438/586 |
| 2007/0269979 A1* | 11/2007 | Cho .............................. | 438/669 |
| 2011/0260288 A1* | 10/2011 | Sukekawa et al. ............ | 257/532 |

\* cited by examiner

*Primary Examiner* — Scott B Geyer
(74) *Attorney, Agent, or Firm* — Winston Hsu; Scott Margo

(57) ABSTRACT

The present invention proposes the use of a silicon nitride layer on top of a second conductive layer. After a step of etching a second conductive layer, an oxide spacer is formed to define a gap. Then, another silicon nitride layer fills up the gap. After that, the oxide spacer is removed. Later, a first conductive layer is etched to separate the digit line to cell contact line.

20 Claims, 12 Drawing Sheets

METHOD OF FABRICATING A CELL CONTACT AND A DIGIT LINE FOR A SEMICONDUCTOR DEVICE

BACKGROUND OF THE INVENTION

1. Field of the Invention

The present invention relates to a method of fabricating a digit line and a cell contact.

2. Description of the Prior Art

A dynamic random access memory (DRAM) device comprises an arrangement of individual memory cells. Each memory cell includes a capacitor capable of holding data as an electrical charge and an access transistor for accessing the charge stored on the capacitor. The data is transmitted on signal lines, referred to as bit lines, or digit lines. The digit line is coupled directly to a source doping region of an access transistor for a particular memory cell. A cell contact couples to a drain doping region of the access transistor for transfer the data from the digit line to the capacitor. The digit line and the cell contact are usually fabricated as metal, silicide or polysilicon.

As the market pressure to increase the memory cell density is continuously growing. A unique fabrication process is needed to reduce the size of the memory cells, and provide an easier approach to form digit lines and cell contacts.

SUMMARY OF THE INVENTION

The present invention aims at fabricating a cell contact and a digit line for a semiconductor device such as a DRAM.

According to one aspect of the invention, a method of fabricating a cell contact and a digit line for a semiconductor device comprises the step as follows. First, a substrate is provided. Then, a first conductive layer, a second conductive layer, a first silicon nitride layer are formed from bottom to top on the substrate. Next, the first silicon nitride layer and the second conductive layer are patterned to form a plurality of line-shaped masks. Later, a pair of spacers are formed at two sides of each of the line-shaped masks respectively, wherein a gap is defined between the spacers. After that, a second silicon nitride layer is formed to fill up the gap. Then, the spacers are removed. Finally, part of the first conductive layer is removed by taking the second silicon nitride layer and the line-shaped masks as a mask.

According to another aspect of the invention, a method of fabricating a cell contact and a digit line for a semiconductor device is provided, wherein the cell contact and the digit line are formed on a substrate, the substrate includes an active area extending along a first direction, a plurality of trench isolations and a plurality of STI structures arranged in the substrate alternately and extending along a second direction, the trench isolations and the STI structures intersect the active area respectively, a drain doping region is disposed in the active area between one of the trench isolations and one of the STI structures, a source doping region is disposed in the active area between one of the trench isolations and one of the STI structures next to the drain doping region. The method comprises the steps as follows. First, a first conductive layer, a second conductive layer, a first silicon nitride layer are formed from bottom to top on the active area, the trench isolations, and the STI structures. Then, the first silicon nitride layer and the second conductive layer are patterned to form a plurality of line-shaped masks extending along the second direction. Later, a pair of spacers are formed at two sides of each of the line-shaped masks so as to form a first gap between the spacers. Next, a second silicon nitride layer is formed to fill up the first gap. Subsequently, the spacers are removed to form a second gap between one of the line-shaped masks and the second silicon nitride layer, wherein the first conductive layer directly above the trench isolations and the STI structures is exposed through the second gap. Finally, the exposed first conductive layer is removed by taking the line-shaped masks and the second silicon nitride layer as a mask.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 1:
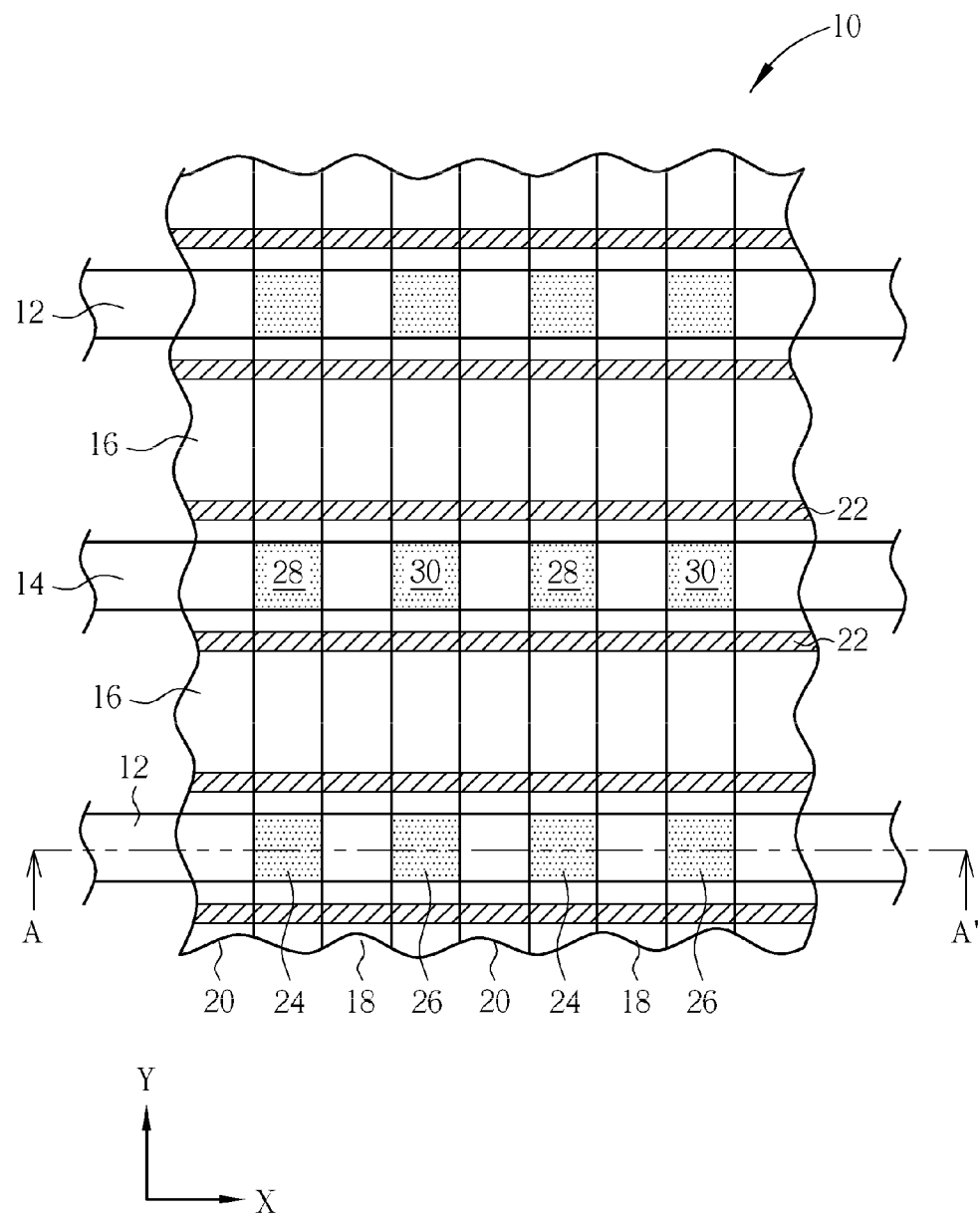
FIG. 1 to FIG. 14 are schematic diagrams showing a method of fabricating a cell contact and a digit line for a semiconductor device.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following description, numerous specific details are given to provide a thorough understanding of the invention. However, it will be apparent to one skilled in the art that the invention may be practiced without these specific details. In order to avoid obscuring the present invention, some well-known system configurations and process steps are not disclosed in detail.

Likewise, the drawings showing embodiments of the apparatus are semi-diagrammatic and not to scale and, particularly, some of the dimensions are for the clarity of presentation and are shown exaggerated in the figures. Also, in which multiple embodiments are disclosed and described having some features in common, for clarity and ease of illustration and description thereof, like or similar features will ordinarily be described with like reference numerals.

Figure 2:
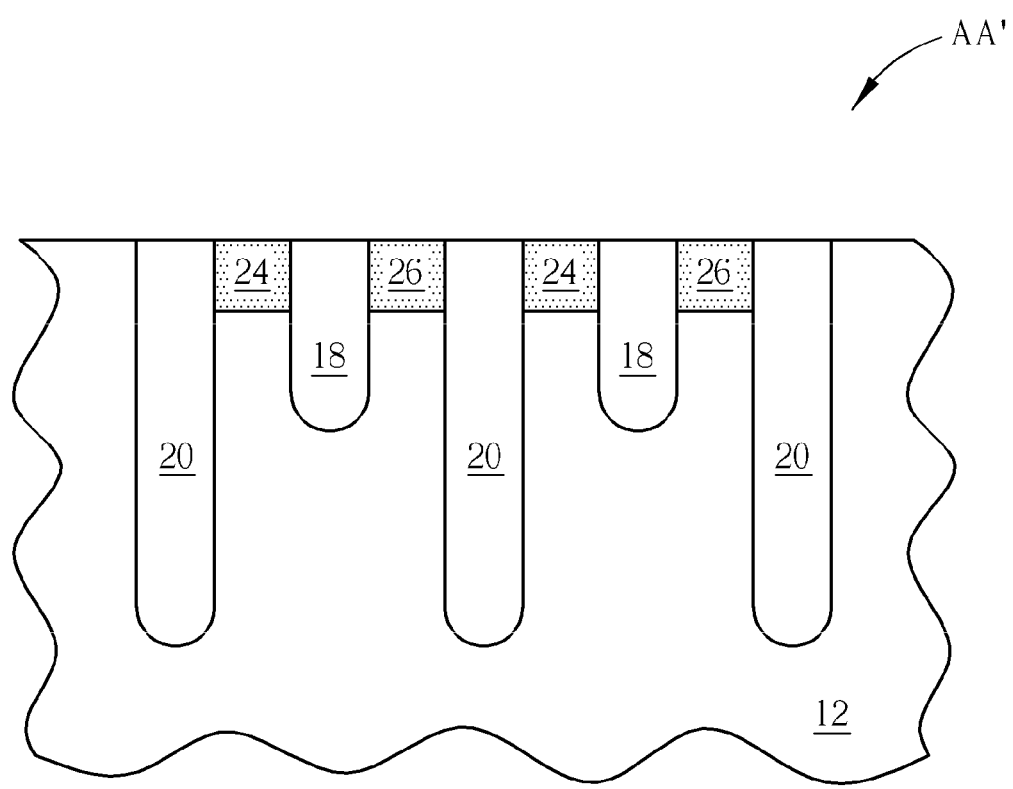

FIG. 1 to FIG. 14 are schematic diagrams showing a method of fabricating a cell contact and a digit line for a semiconductor device. FIG. 1 is a schematic layout diagram showing a portion of a cell array in accordance with one preferred embodiment of this invention. FIG. 2 shows a schematic, cross-sectional view of the cell array of the invention, which are taken along line AA' (reference x-axis direction).

Please refer to FIG. 1 and FIG. 2, a substrate 10 is provided. The substrate 10 may be a semiconductor substrate including but not limited to silicon substrate, silicon substrate with an epitaxial layer, SiGe substrate, silicon-on-insulator (SOI) substrate, gallium arsenide (GaAs) substrate, gallium arsenide-phosphide (GaAsP) substrate, indium phosphide (InP) substrate, gallium aluminum arsenic (GaAlAs) substrate, or indium gallium phosphide (InGaP) substrate. The substrate 10 includes a first active area 12, a second active area 14, and an insulating 16 area such as a field oxide sandwiched between the first active area 12 and the second active area 14. The first active area 12, the second active area 14 and the insulating area 16 extend along the reference x-axis direction. Numerous trench isolations 18 and STI structures 20 are arranged in the substrate 10 alternately and extend along the reference y-axis direction. The reference x-axis direction is perpendicular to the reference y-axis direction. The trench isolations 18 and the STI structures 20 intersect with the first active area 12, the insulating area 16, and the second active area 14. A gate electrode 22 is embedded in the insulating area 16 and extends along the reference x-axis direction.

A first drain doping region 24 is disposed in the first active area 12 between one of the trench isolations 18 and one of the STI structures 20. A first source doping region 26 is disposed in the first active area 12 between one of the trench isolations 18 and one of the STI structures 20, and the first source doping region 26 is next to the first drain doping region 24. A second drain doping region 28 is disposed in the second active area 14 between one of the trench isolations 18 and one of the STI structures 20. A second source doping region 30 is disposed in the second active area 14 between one of the trench isolations 18 and one of the STI structures 20, and the second source doping region 30 is next to the second drain doping region 28. For the sake of brevity, FIG. 2 only shows a cross-sectional view of the first active area 12, because the cross-sectional view of the second active area 14 is substantially identical to that of the first active area 12.

Figure 3:
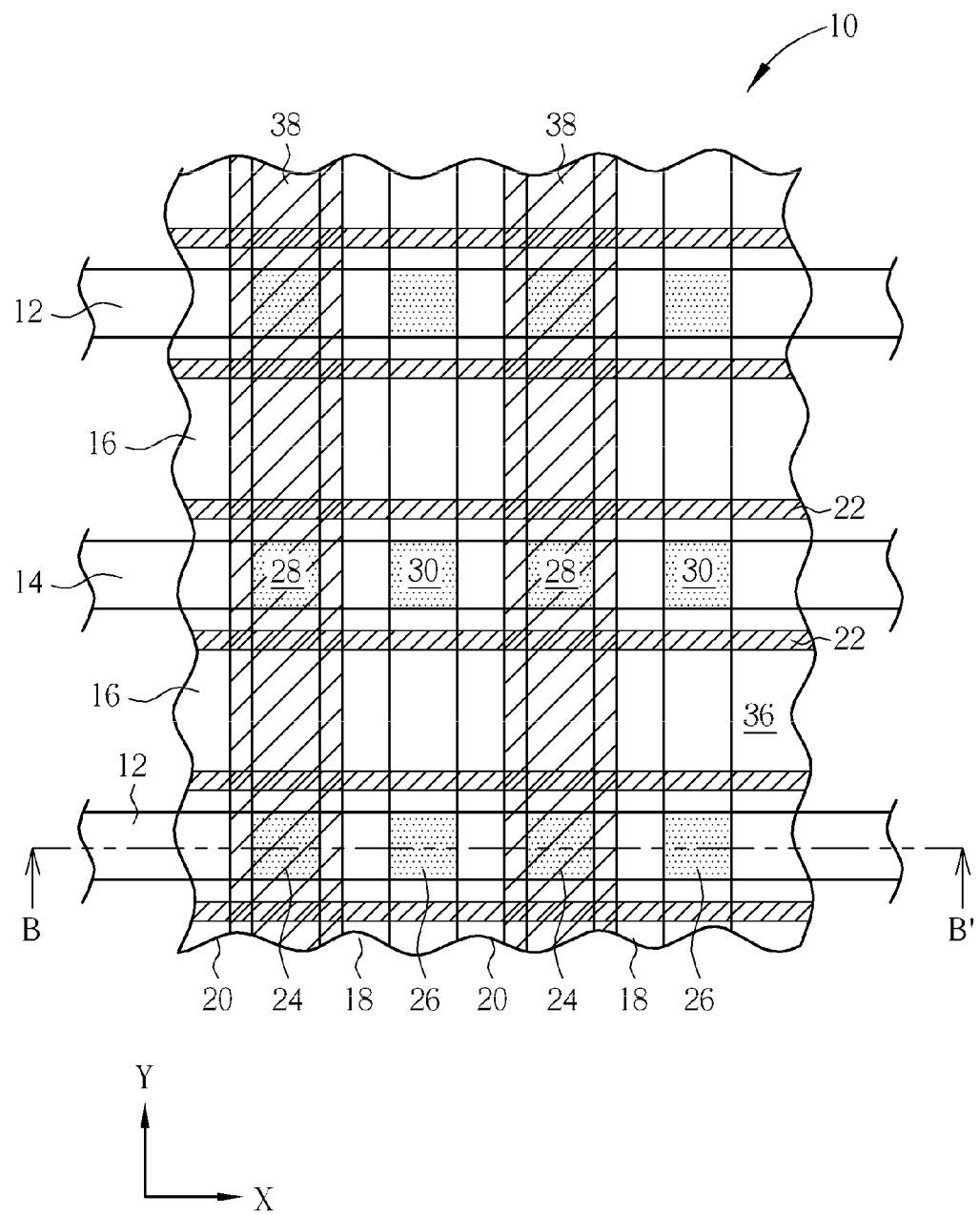
Figure 4:
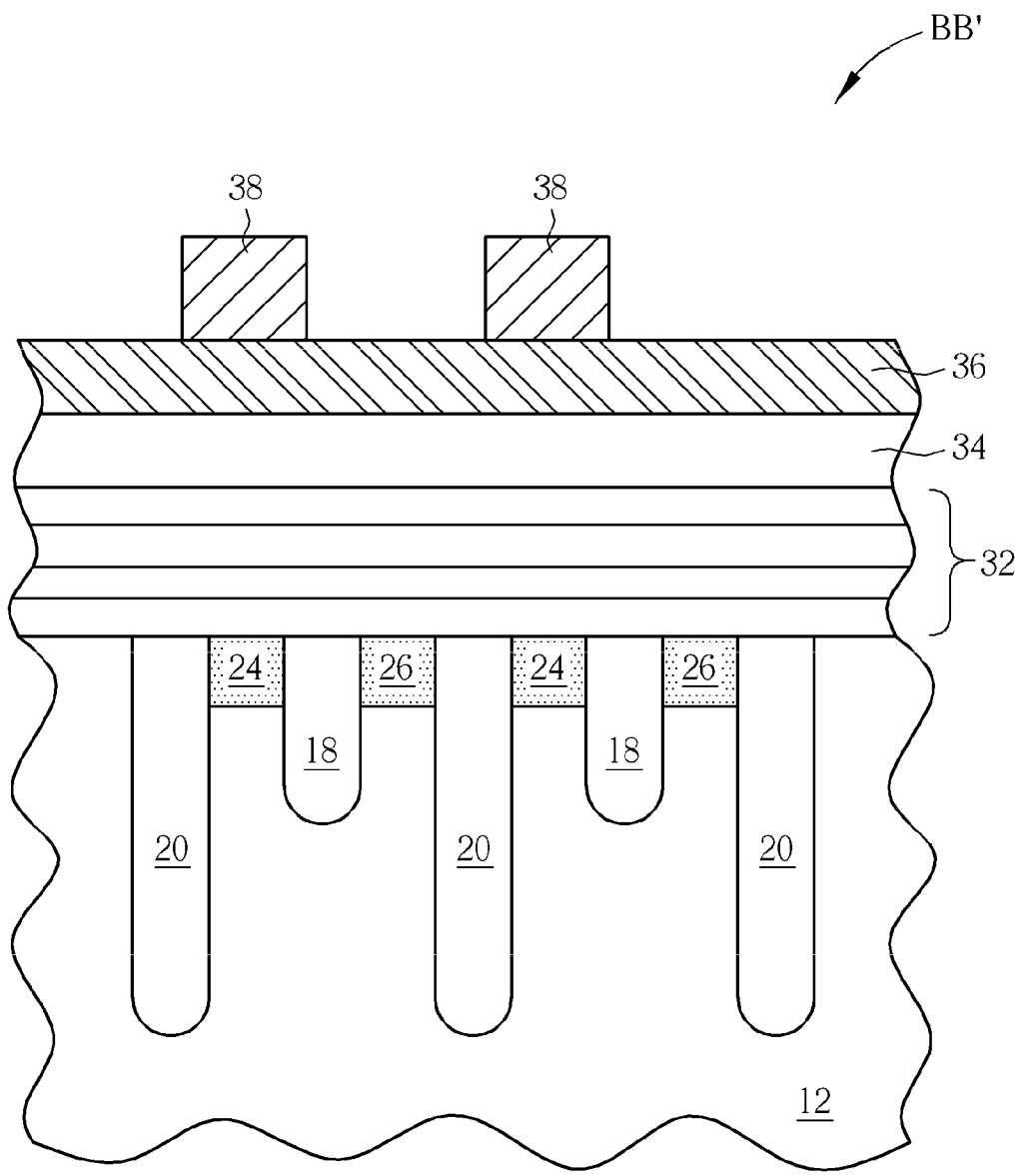

FIG. 3 is a schematic layout diagram showing a portion of a cell array covered with a patterned photoresist in accordance with one preferred embodiment of this invention. FIG. 4 shows a schematic, cross-sectional view of FIG. 3, which are taken along line BB' (reference x-axis direction).

As shown in FIG. 3 and FIG. 4, a first conductive layer 32, a second conductive layer 34 and a silicon nitride layer 36 are formed from bottom to top on the surface of the substrate 10. The first conductive layer 32, the second conductive layer 34 and the silicon nitride layer 36 cover the first active area 12, the second active area 14, the STI structures 20, the trench isolations 18 and the insulating area 16. The first conductive layer 32 may comprise TiN, W, Ti, WN, polysilicon or combinations thereof. The second conductive layer 34 may be W. Then, a patterned photoresist 38 is formed on the silicon nitride layer 36. The patterned photoresist 38 is line-shaped and overlaps with the first drain doping region 24, the second drain doping region 28, part of the STI structures 20 and part of the trench isolations 18. The patterned photoresist 38 extends along the reference y-axis direction.

Figure 5:
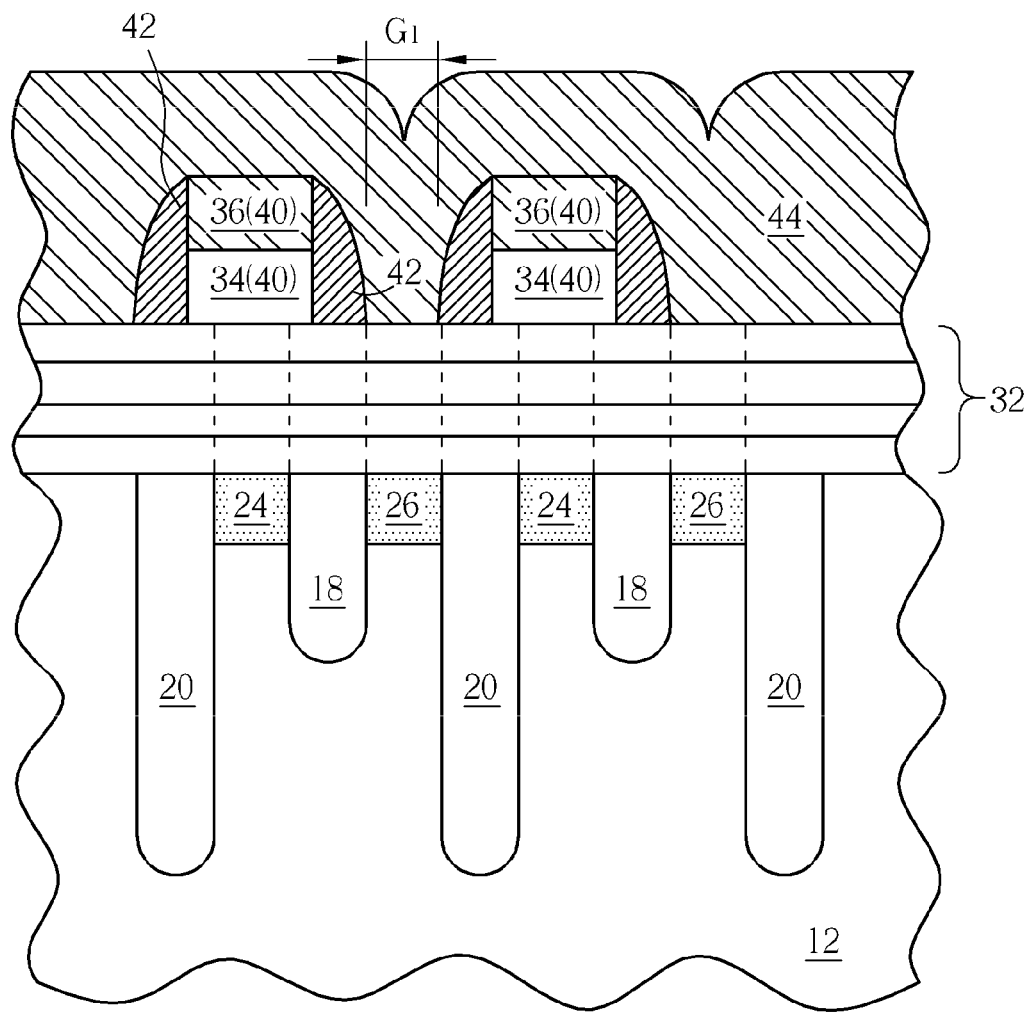

As show in FIG. 5, the silicon nitride layer 36 and the second conductive layer 34 are etched by taking the patterned photoresist 38 as a mask so that a plurality of line-shaped masks 40 extends along the reference y-axis direction are formed. The line-shaped masks 40 are composed of the silicon nitride layer 36 and the second conductive layer 34. Furthermore, the width of one line-shaped mask 40 is preferably about 20 nm. The space between two adjacent line-shaped masks 40 is preferably around 40 nm.

Moreover, the line-shaped masks 40 cover the first conductive layer 32 directly on the first drain doping region 24 and the second drain doping region (not shown). In other words, the first conductive layer 32 directly on the first source doping region 26, the second source doping region (not shown), part of the STI structures 20 and part of the trench isolations 18 is exposed.

Later, a pair of spacers 42 are formed on the two opposite sides of each of the line-shaped masks 40. The width of one of the spacers 42 is preferably 10 to 12 nm. In this way, a first gap $G_1$ is defined between the spacers 42. Now, the first conductive layer 32 directly on the first source doping region 26 and the second source doping region (not shown) is exposed through first gap $G_1$. Next, a silicon nitride layer 44 is formed blankly to fill up the first gap $G_1$.

Figure 6:
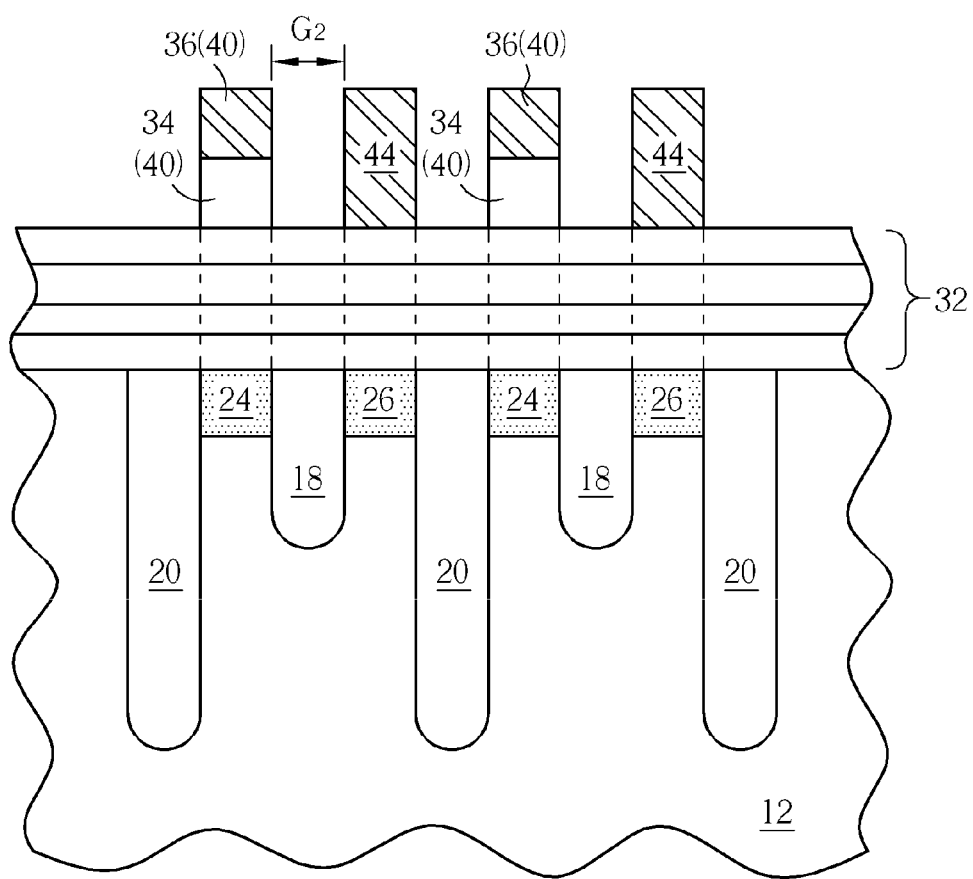

As shown in FIG. 6, the silicon nitride layer 44 is planarized so that the top surface of the silicon nitride layer 44 is aligned with the silicon nitride layer 36. Then, the spacers 42 are removed so as to form a second gap $G_2$ between one of the line-shaped masks 42 and the silicon nitride layer 44. The spacers 42 can be removed by a wet etch process with excellent selectivity to the first conductive layer 32, the second conductive layer 34 and the silicon nitride layer 36. Now, the first conductive layer 32 directly on the trench isolations 18 and STI structures 20 is exposed.

Figure 7:
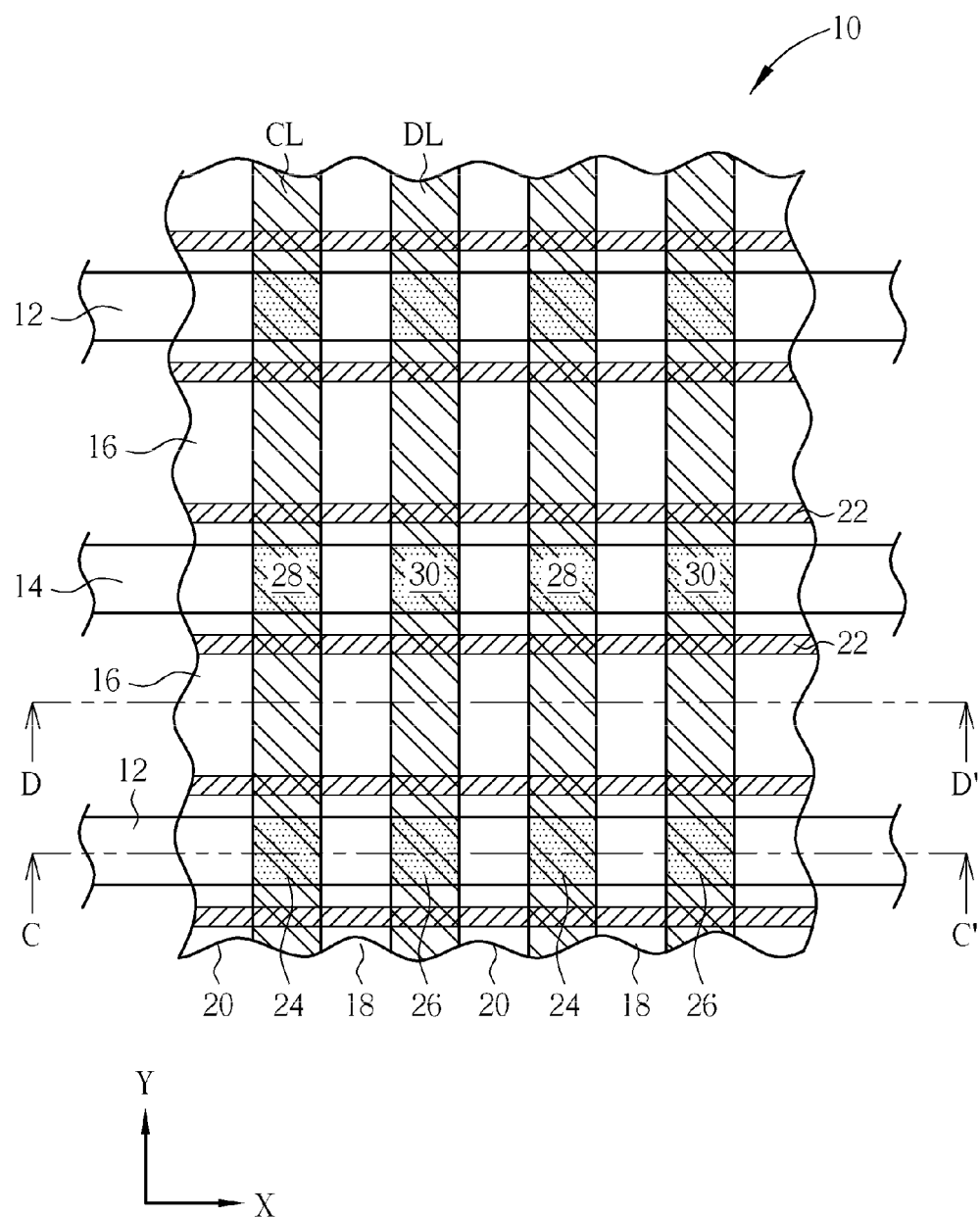
Figure 8:
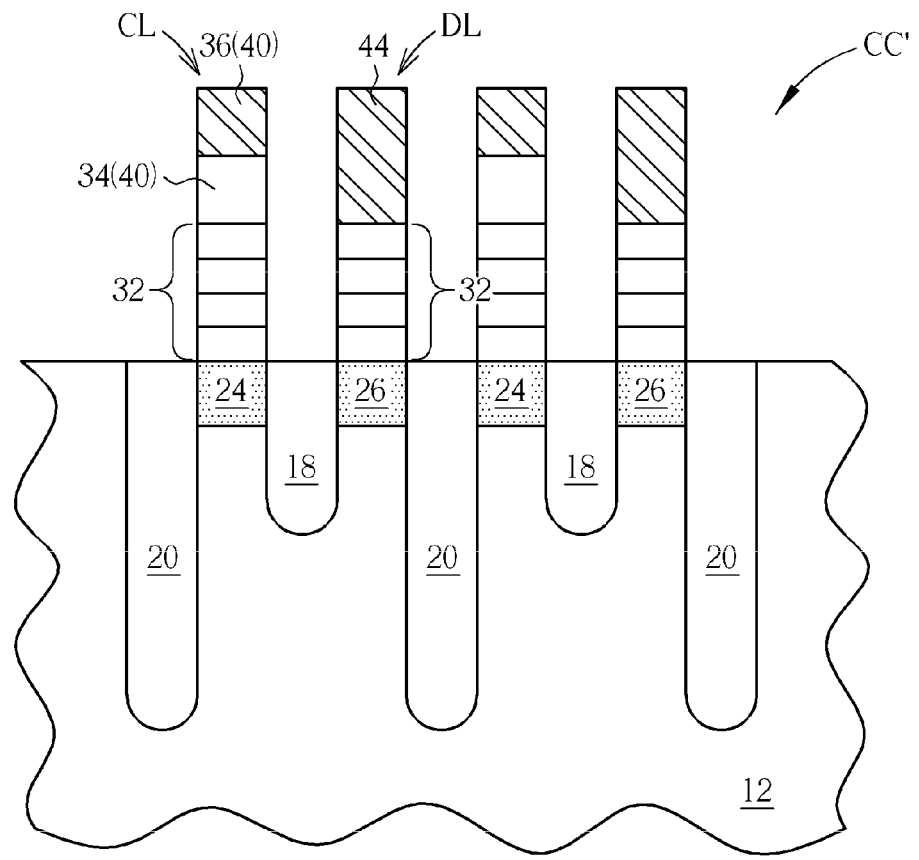

FIG. 7 is a schematic layout diagram showing a formation of a digit line and a cell contact line. FIG. 8 shows a schematic, cross-sectional view of FIG. 7, which is taken along line CC' (reference x-axis direction). FIG. 8 shows a schematic, cross-sectional view of FIG. 7, which is taken along line DD' (reference x-axis direction).

As shown in FIG. 7, the line CC' crosses the first active area 12 and the line DD' crosses one of the insulating areas 16.

Figure 9:
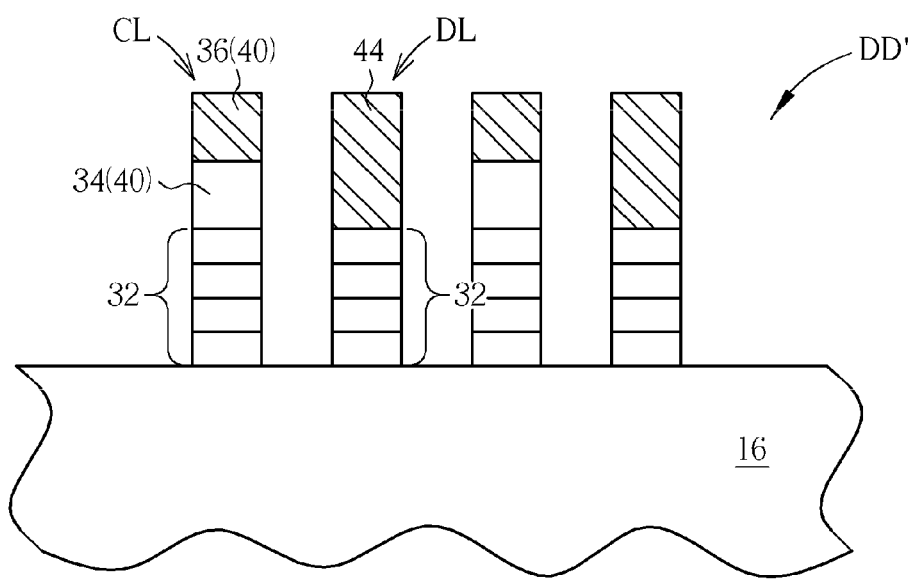

As shown in FIG. 7 and FIG. 8, the first conductive layer 32 directly on the trench isolations 18 and STI structures 20 is etched by taking the line-shaped masks 40 and the silicon nitride layer 44 as a mask. Now, the first contact layer 32 directly on the first source doping region 26 and the second source doping region 30 serves as a digit line DL. The first conductive layer 32 and the second conductive layer 34 directly on the first drain doping region 24 and the second drain doping region 28 becomes a cell contact line CL, which will be segmented to become many individual cell contacts afterwards. Furthermore, as shown in FIG. 7 and FIG. 9, the cell contact line CL and the digit line DL both extend along the reference y-axis direction continuously.

Figure 10:
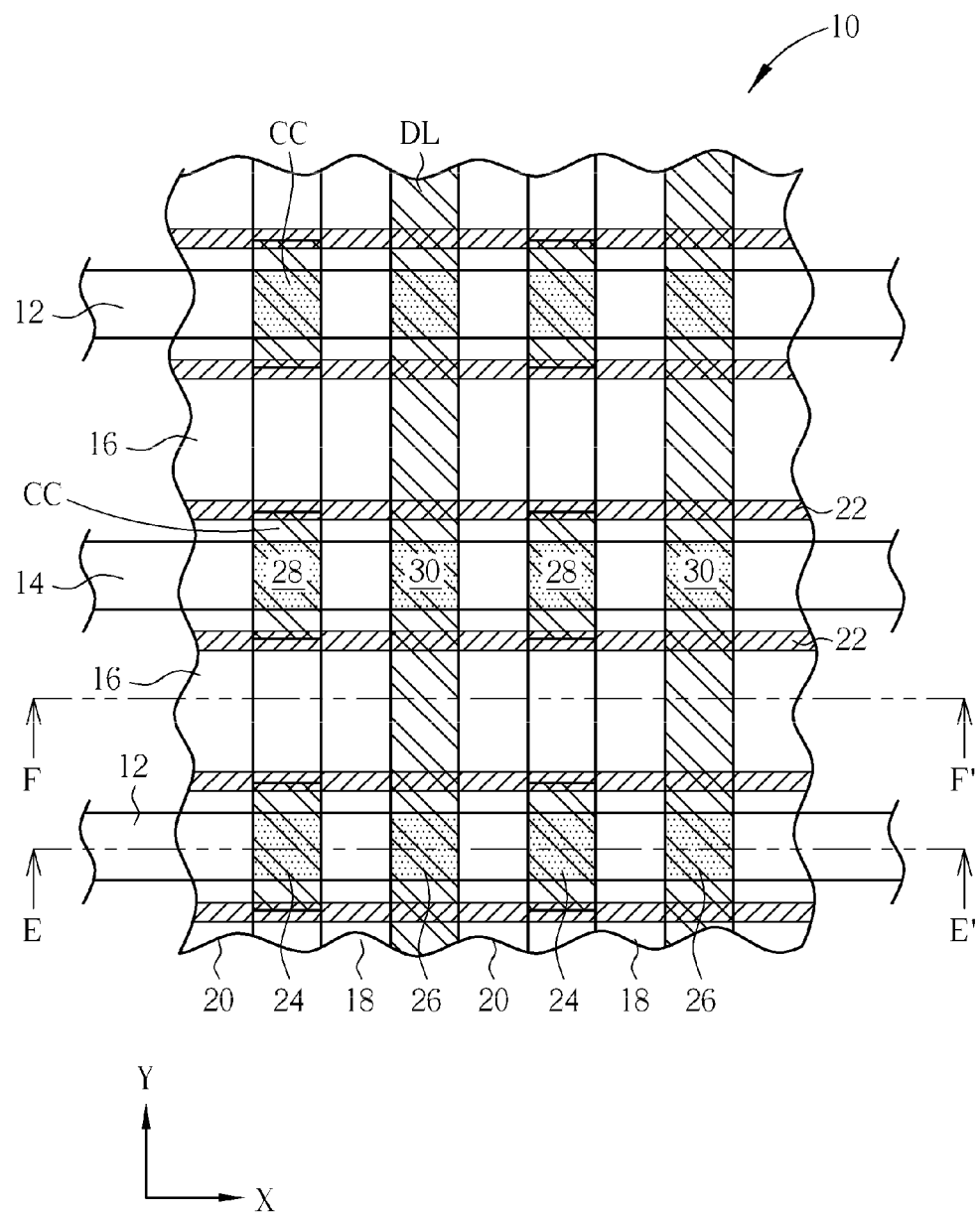
Figure 11:
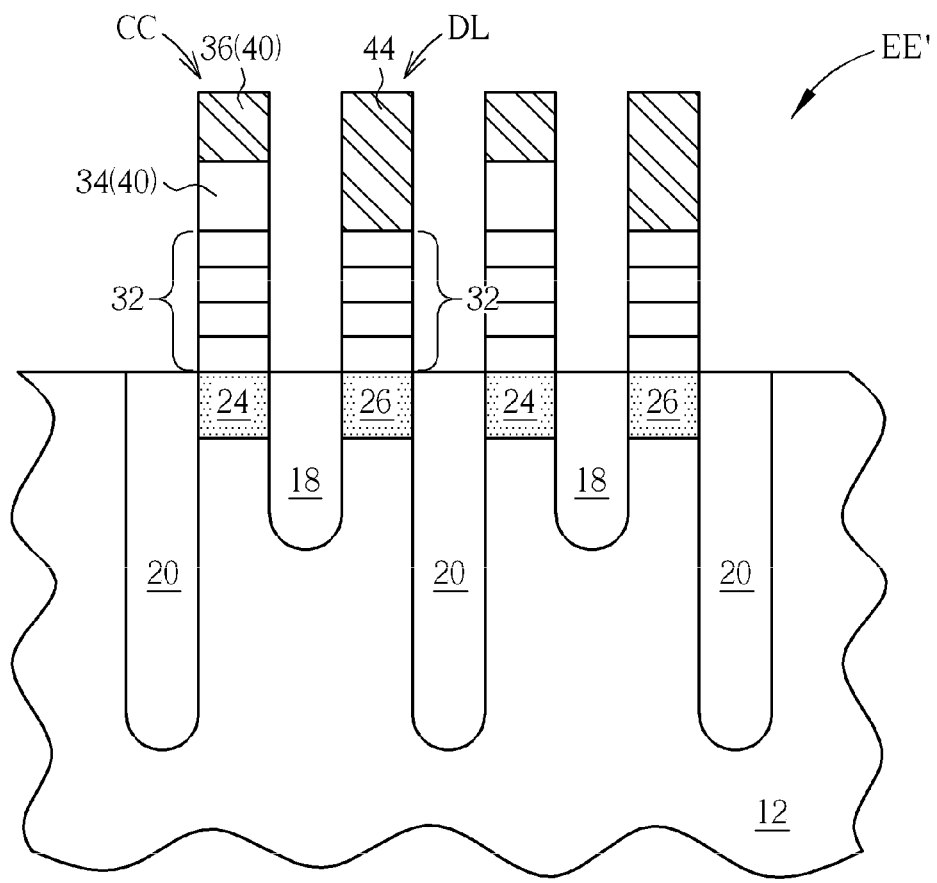
Figure 12:
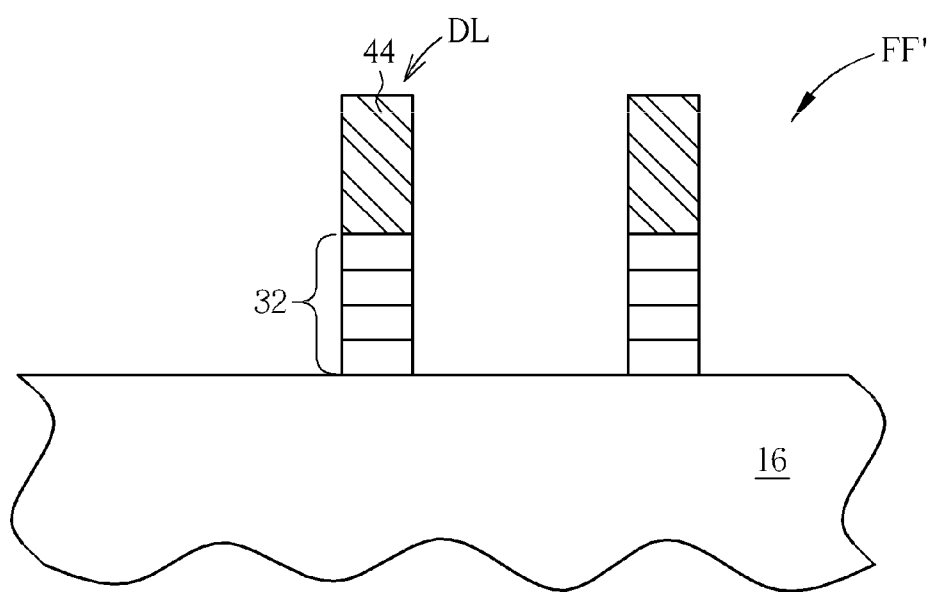

FIG. 10 is a schematic layout diagram showing a step of segmenting the cell contact line. FIG. 11 shows a schematic, cross-sectional view of FIG. 10, which is taken along line EE' (reference x-axis direction). FIG. 12 shows a schematic, cross-sectional view of FIG. 10, which is taken along line FF' (reference x-axis direction). The line EE' crosses the first active area 12 and the line FF' crosses the insulating area 16.

Please refer to FIGS. 10 to 12. The cell contact line CL is separated into individual cell contacts CC by removing the cell contact line CL directly on the insulating area 16 partly without chopping off the digit line DL. The cell contact line CL may be removed by a dry etch process.

Figure 13:
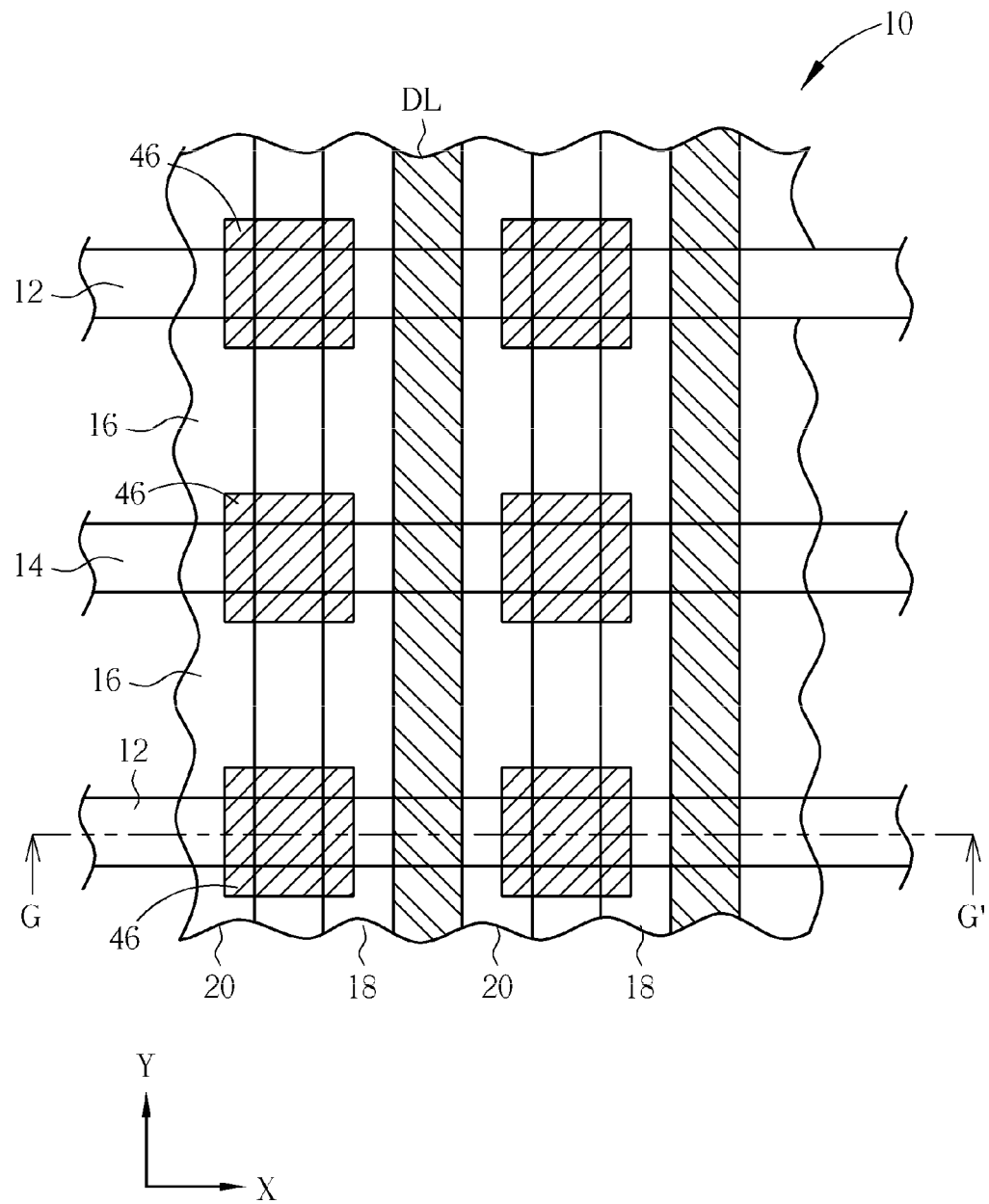
Figure 14:
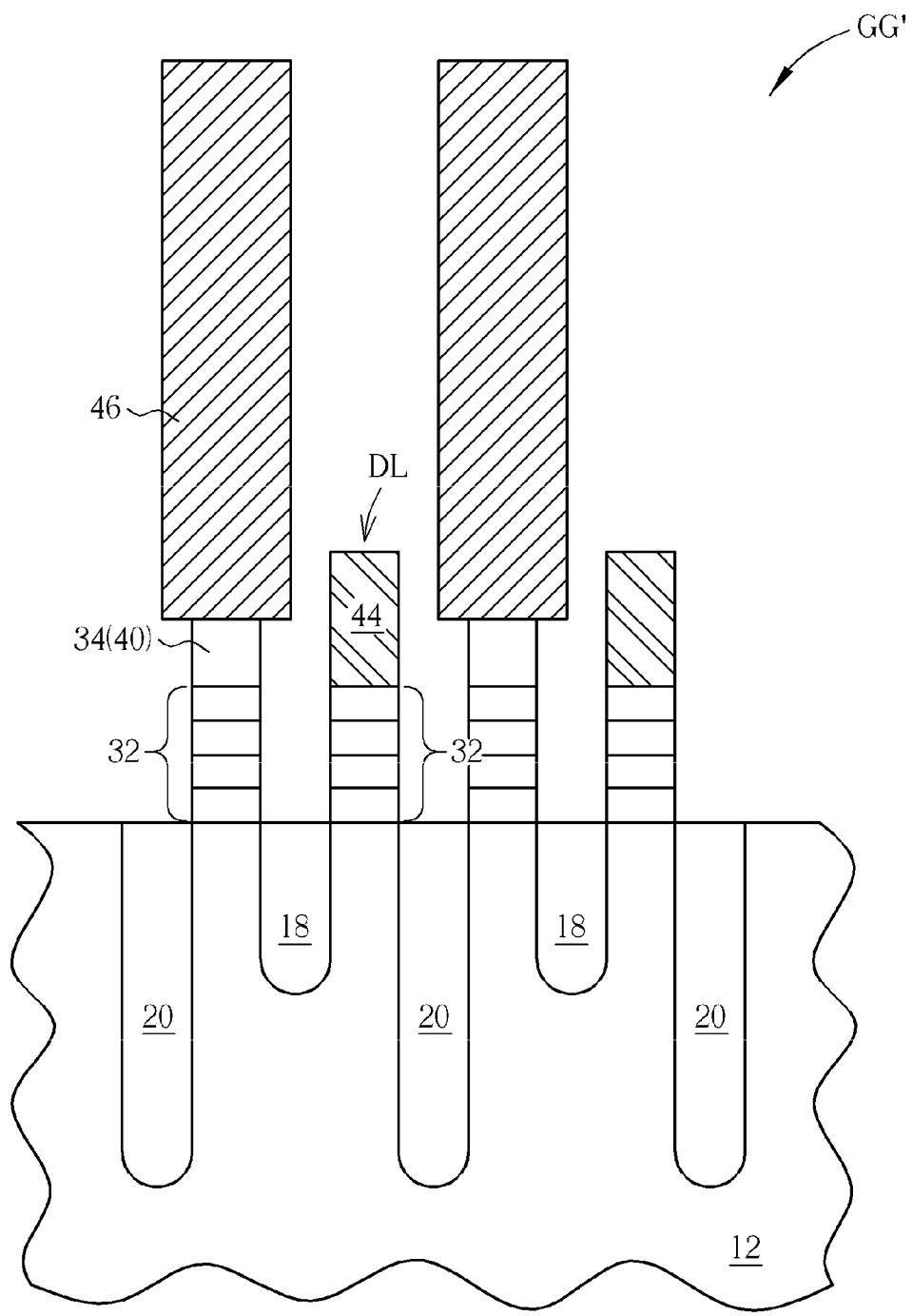

FIG. 13 is a schematic layout diagram showing a step of forming a capacitor. FIG. 14 shows a schematic, cross-sectional view of FIG. 13, which is taken along line GG' (reference x-axis direction).

Please refer to FIG. 13 and FIG. 14, the silicon nitride layer 36 on the cell contacts CC is removed. Then, at least one capacitor 46 is formed to couple one of the cell contacts CC. Now, a DRAM is completed.

Those skilled in the art will readily observe that numerous modifications and alterations of the device and method may be made while retaining the teachings of the invention.

What is claimed is:
1. A method of fabricating a cell contact and a digit line for a semiconductor device, comprising:
  providing a substrate (10);
  forming a first conductive layer (32), a second conductive layer (34), a first silicon nitride layer (36) from bottom to top on the substrate;
  patterning the first silicon nitride layer and the second conductive layer to form a plurality of line-shaped masks (40);

forming a pair of spacers (42) at two sides of each of the line-shaped masks respectively, wherein a gap (G1) is defined between the spacers;

forming a second silicon nitride (44) layer to fill up the gap;

removing the spacers; and removing part of the first conductive layer by taking the second silicon nitride layer and the line-shaped masks as a mask.

2. The method of fabricating a cell contact and a digit line for a semiconductor device of claim 1, wherein the first conductive layer directly under the second silicon nitride layer serves as a digit line (DL).

3. The method of fabricating a cell contact and a digit line for a semiconductor device of claim 2, wherein the digit line is disposed on a source doping region (26) within the substrate.

4. The method of fabricating a cell contact and a digit line for a semiconductor device of claim 3, wherein a STI structure (20) is embedded in the substrate besides the source doping region.

5. The method of fabricating a cell contact and a digit line for a semiconductor device of claim 1, wherein the first conductive layer and the second conductive layer directly under the first silicon nitride layer serves as a cell contact line (CL).

6. The method of fabricating a cell contact and a digit line for a semiconductor device of claim 5, wherein the cell contact line is disposed on a drain doping region (24) within the substrate.

7. The method of fabricating a cell contact and a digit line for a semiconductor device of claim 6, wherein a STI structure is embedded in the substrate beside the drain doping region.

8. The method of fabricating a cell contact and a digit line for a semiconductor device of claim 6, further comprising segmenting the cell contact line into a plurality of cell contacts (CC).

9. The method of fabricating a cell contact and a digit line for a semiconductor device of claim 1, wherein the first conductive layer comprises TiN, W, Ti, WN, polysilicon or combinations thereof.

10. The method of fabricating a cell contact and a digit line for a semiconductor device of claim 1, wherein the second conductive layer comprises W.

11. The method of fabricating a cell contact and a digit line for a semiconductor device of claim 1, the spacers are made of silicon oxide.

12. A method of fabricating a cell contact and a digit line for a semiconductor device, wherein the cell contact and the digit line are formed on a substrate (10), the substrate includes an active area (12) extending along a first direction, a plurality of trench isolations (18) and a plurality of STI structures (20) arranged in the substrate alternately and extending along a second direction, the trench isolations and the STI structures intersect the active area respectively, a drain doping region (24) disposed in the active area between one of the trench isolations and one of the STI structures, a source doping (26) region disposed in the active area between one of the trench isolations and one of the STI structures next to the drain doping region, and the method comprises:

forming a first conductive layer (32), a second conductive layer (34), a first silicon nitride layer (36) from bottom to top on the active area, the trench isolations, and the STI structures;

patterning the first silicon nitride layer and the second conductive layer to form a plurality of line-shaped masks (40) extending along the second direction;

forming a pair of spacers (42) at two sides of each of the line-shaped masks so as to form a first gap (G1) between the spacers;

forming a second silicon nitride layer (44) filling up the first gap;

removing the spacers to form a second gap (G2) between one of the line-shaped masks and the second silicon nitride layer, wherein the first conductive layer directly above the trench isolations and the STI structures is exposed through the second gap; and removing the exposed first conductive layer by taking the line-shaped masks and the second silicon nitride layer as a mask.

13. The method of fabricating a cell contact and a digit line for a semiconductor device of claim 12, wherein the second conductive layer comprises W.

14. The method of fabricating a cell contact and a digit line for a semiconductor device of claim 12, wherein the first conductive layer comprises TiN, W, Ti, WN, polysilicon or combination thereof.

15. The method of fabricating a cell contact and a digit line for a semiconductor device of claim 12, wherein the spacers are made of silicon oxide.

16. The method of fabricating a cell contact and a digit line for a semiconductor device of claim 12, wherein the first conductive layer, the second conductive layer directly above the drain doping region serves as a cell contact line.

17. The method of fabricating a cell contact and a digit line for a semiconductor device of claim 16, further comprising segmenting the cell contact line into a plurality of cell contacts (CC).

18. The method of fabricating a cell contact and a digit line for a semiconductor device of claim 12, wherein the first conductive layer directly above the source doping region 26 serves as a digit line (DL).

19. The method of fabricating a cell contact and a digit line for a semiconductor device of claim 12, wherein the first direction is perpendicular to the second direction.

20. The method of fabricating a cell contact and a digit line for a semiconductor device of claim 12, wherein after forming the spacers, the first conductive layer directly on the source doping region is exposed through the first gap.

* * * * *